(12) United States Patent
Watanabe

(10) Patent No.: US 6,311,023 B1
(45) Date of Patent: *Oct. 30, 2001

(54) CAMERA HAVING A LIGHT-SHIELDABLE MEMBER FOR PROTECTING A SEMICONDUCTOR ELEMENT FLIP-CHIP-BONDED ON A FLEXIBLE PRINTED BOARD

(75) Inventor: Akira Watanabe, Tokyo (JP)

(73) Assignee: Olympus Optical Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,937

(22) Filed: Nov. 24, 1998

(30) Foreign Application Priority Data

Dec. 3, 1997 (JP) .................................................... 9-333218

(51) Int. Cl.$^7$ ...................................................... G03B 17/00
(52) U.S. Cl. .............................................. 396/542; 257/778
(58) Field of Search ............................... 396/542; 257/778

(56) References Cited

U.S. PATENT DOCUMENTS

| 5,508,781 | * | 4/1996 | Imai et al. ............................ 396/542 |
| 5,592,255 | * | 1/1997 | Wakabayashi et al. ............... 396/542 |
| 5,708,865 | * | 1/1998 | Soshi et al. ........................... 396/542 |
| 5,752,119 | * | 5/1998 | Miyamoto et al. ................... 396/542 |

FOREIGN PATENT DOCUMENTS

| 60-180132 | 9/1985 | (JP) . |
| 7-211423 | 8/1995 | (JP) . |

* cited by examiner

Primary Examiner—David M. Gray
(74) Attorney, Agent, or Firm—Volpe and Koenig, P.C.

(57) ABSTRACT

A camera having a flexible printed board on which a semiconductor element is flip-chip-bonded, a light-shieldable member such as a housing, a lens barrel, or an outer member. An element formation surface of a semiconductor element flip-chip-bonded on the flexible printed board is arranged to oppose the light-shieldable member.

8 Claims, 2 Drawing Sheets

CAMERA HAVING A LIGHT-SHIELDABLE MEMBER FOR PROTECTING A SEMICONDUCTOR ELEMENT FLIP-CHIP-BONDED ON A FLEXIBLE PRINTED BOARD

BACKGROUND OF THE INVENTION

1. Field of the Invention

The present invention relates to a camera and, more particularly, to a camera comprising a flexible printed board on which a semiconductor element is flip-chip-bonded.

2. Description of the Related Art

In a conventional compact device such as a camera, a flexible printed board is frequently employed to arrange various electric circuits in a compact housing. A technical means for bonding an element such as an IC by a so-called flip chip bonding method is also known.

This flip chip bonding method is a bonding method for arranging an element such as an IC on a printed board upside down. According to this method, an external electrode on the IC is subjected to a bump (projection) process to directly connect the external electrode to the pattern of the board or to connect the external electrode to the pattern through conductive particles. As a concrete example of the flip chip bonding method, a bonding method is disclosed in Japanese Examined Patent Publication No. 62-6652, Japanese Unexamined Patent Publication No. 7-211423, and the like.

A general flexible printed board is formed such that a copper foil is interposed between sheets each having a thickness of several tens Fm. Since the sheet consists of an almost transparent material such as polyimide or polyester, the flexible printed board is considerably inferior to a hard printed board in light-shielding property.

When a semiconductor element such as an IC is bonded on a flexible printed board being inferior in light-shielding property by the flip chip bonding method, the following drawbacks occur. More specifically, when such a flexible printed board is applied to a product such as a camera which is used under outside strong light or a product used to guide object light to the inside of the product, sunlight, illumination light, or leakage light from a built-in electronic flash, a date LED, or the like is incident on the surface of the semiconductor element such as an IC because the flexible printed board itself is inferior in light-shielding property as described above. As a result, in the semiconductor element, a change in performance or an erroneous operation is disadvantageously caused by a photo-electric effect.

SUMMARY OF THE INVENTION

It is a first object of the present invention to provide a camera in which, even if the camera comprises a flexible printed board on which a semiconductor element is flip-chip-bonded, the surface of the semiconductor element is shielded from external light or the like.

It is a second object of the present invention to provide a camera in which a change in performance, an erroneous operation, or the like caused by the photo-electric effect of an element on an internal semiconductor can be easily prevented.

In short, a camera according to the present invention has a flexible printed board on which a semiconductor element is flip-chip-bonded and a light-shieldable member such as a housing, a lens barrel, and an outer member, wherein an element formation surface for the semiconductor element flip-chip-bonded on the flexible printed board is arranged opposite the light-shieldable member.

These as well as other objects and advantages of the present invention will become further apparent from the following detailed explanation.

DETAILED DESCRIPTION OF THE PREFERRED EMBODIMENTS

Embodiments of the present invention will be described below with reference to the accompanying drawings.

Figure 1:
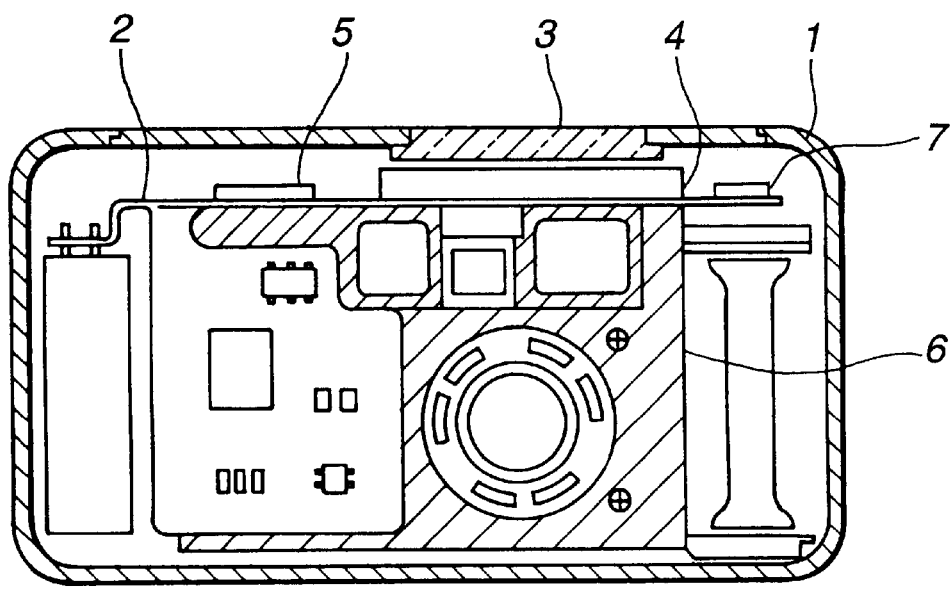
FIG. 1 is a sectional view showing the front surface of a camera according to a first embodiment of the present invention wherein the outer member of the camera is partially cut away.

FIG. 1 is a sectional view showing the front surface of a camera (comprising a flexible printed board) according to the first embodiment of the present invention when the outer cover member of the camera is partially cut away.

As shown in FIG. 1, in the camera according to this embodiment, an LCD window 3 for an LCD display is arranged on the upper surface of an outer member 1, and an LCD 4 bonded on a flexible printed board 2 is arranged in the camera to be aligned with the LCD window 3. The LCD 4 performs a display operation according to a predetermined signal from the flexible printed board 2.

The flexible printed board 2 is arranged along the body surface throughout a plurality of surfaces on a camera body 6, and predetermined electronic circuit parts are bonded on the surface of the flexible printed board 2. A semiconductor 5 is bonded on the flexible printed board 2 by a so-called flip chip bonding method, and an element formation surface 5a of the semiconductor 5 is arranged upside down so as to face the upper surface side of the flexible printed board 2. For this reason, the element formation surface 5a of the semiconductor 5 is bonded on a surface facing toward the camera body 6 or mounted directly upon the camera body 6 or mounted directly upon the camera body 6 serving as a light-shielding member, so that external light being incident on the element can be suppressed to a minimum.

In a general camera, a black box is formed in a portion for holding a film or an image pickup element to assure a light-shielding property. However, light from the LCD window 3 serving as a transparent member or the seam or the like of the outer member 1 is easily incident on a portion where electric circuit parts are arranged, and external light cannot be easily prevented from being incident on the portion.

Even if the outer member is completely airtightly closed, as described above, the electric circuit parts are exposed to external light during assembly or restoration of the camera.

The camera according to this embodiment is characterized in that, with the above arrangement, external light can be prevented from being incident on a semiconductor element as much as possible.

Figure 2:
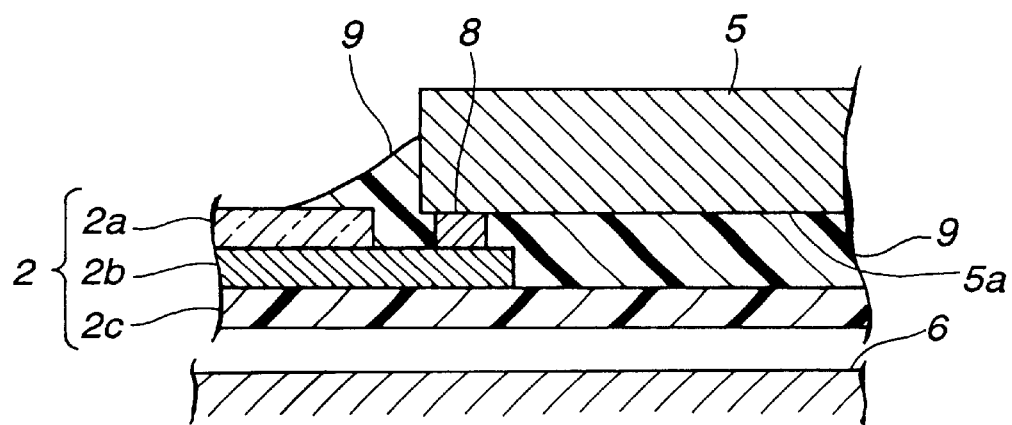
FIG. 2 is a sectional view showing a further detailed state of a main part of a semiconductor flip-chip-bonded on a flexible printed board in the camera according to the first embodiment.

FIG. 2 is a sectional view showing a further detailed state of a main part of the semiconductor 5 flip-chip-bonded on the flexible printed board 2.

The flexible printed board 2, as shown in FIG. 2, is constituted by a base material 2c, a cover layer 2a, and a copper pattern 2b. The copper pattern 2b is mounted on the base material 2c and covered with the cover layer 2a. More specifically, the copper pattern 2b is interposed between the cover layer 2a and the base material 2c.

The cover layer 2a and the base material 2c consist of an almost transparent material such as polyimide. Therefore, it can be regarded that the copper pattern 2b cannot be shielded from external light or internal light by the cover layer 2a and the base material 2c.

The semiconductor 5 is connected to the copper pattern 2b through a bump portion 8. More specifically, the bump portion 8 is arranged on an external electrode of the semiconductor 5, so that a predetermined electrode of the semiconductor 5 is directly connected to the copper pattern 2b or is connected to the copper pattern 2b through conductive particles (not shown) or the like.

An adhesive 9 is filled in a very thin space formed around the bump portion 8 and between the semiconductor 5 and the base material 2c. The adhesive 9 adhere the flexible printed board 2 to the semiconductor 5. The adhesive 9 may contain the above-described conductive particles.

The camera body 6 having an excellent light-shielding property is arranged below the flexible printed board 2 arranged as described above. In this manner, the light-shielding property of the camera body 6 prevents external light from being incident on the semiconductor 5, and provides an advantage of easily preventing a change in performance, an erroneous operation, and the like caused by the photo-electric effect of the element on the semiconductor can be obtained.

It is desirable to directly mount the flexible printed board 2 on the camera body 6, as a matter of course. However, even if the flexible printed board 2 is arranged on the camera body 6 with a gap having a very small distance, as shown in FIG. 2, the above advantage can be sufficiently obtained.

In this embodiment, as a light-shielding means for the semiconductor 5, the camera body is employed. However, the present invention is not limited to the camera body. Any member such as another hard printed board which has a light-shielding property and can be arranged near the semiconductor 5 may be used as the light-shielding means. More specifically, the hard printed board 14, shown in dotted fashion in FIG. 2, may be positioned adjacent to the bottom surface of base material 2C.

A camera (comprising a flexible printed board) according to the second embodiment of the present invention will be described below.

In the first embodiment, the flexible printed board 2 on which the semiconductor 5 is flip-chip-bonded is arranged along the body surface such that the flexible printed board 2 is mounted on the camera body 6. However, the second embodiment is characterized in that a flexible printed board on which a semiconductor is flip-chip-bonded is arranged along an external member.

Figure 3:
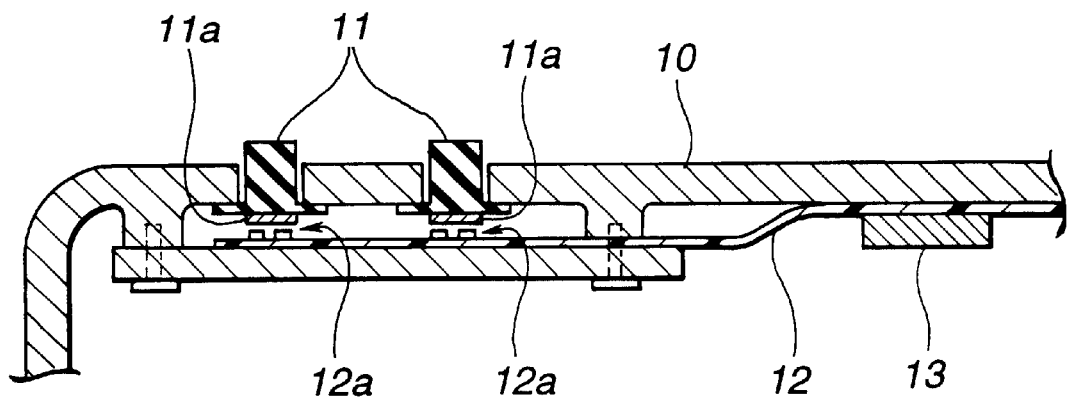
FIG. 3 is an enlarged sectional view showing the front surface of a main part of a camera according to the second embodiment of the present invention when the outer member of the camera is partially cut away.

FIG. 3 is an enlarged sectional view showing the front surface of a main part of a camera (comprising a flexible printed board) according to the second embodiment of the present invention with the outer cover member of the camera partially cut away.

As shown in FIG. 3, the second embodiment is characterized in that a flexible printed board 12 on which a semiconductor 13 is flip-chip-bonded is arranged to be in contact with an outer member 10 near a portion where the semiconductor 13 is bonded.

It is assumed that the flexible printed board 12 has the same arrangement as that of the flexible printed board 2 in the first embodiment and that the flexible printed board 12 has no light-shielding property for external light.

A conductive rubber 11a is integrally fixed to the lower surface of a rubber button switch 11 arranged on the outer member 10. The rubber button switch 11 is pressed downward to short-circuit a copper pattern 12a on the flexible printed board 12, thereby turning on a predetermined switch.

The semiconductor 13 is an IC for processing signals from a plurality of rubber button switches 11. The semiconductor 13 is bonded such that its element formation surface opposes the outer member 10 side.

In this manner, as in the second embodiment, the light-shielding property of the outer member 10 prevents external light from being incident on the semiconductor 13.

A camera (comprising a flexible printed board) according to the third embodiment of the present invention will be described below.

In the first embodiment, the flexible printed board 2 on which the semiconductor 5 is flip-chip-bonded is mounted on the camera body 6. In contrast to this, the third embodiment is characterized in that a flexible printed board on which a semiconductor is flip-chip-bonded is arranged along the inner wall surface of a lens barrel.

Figure 4:
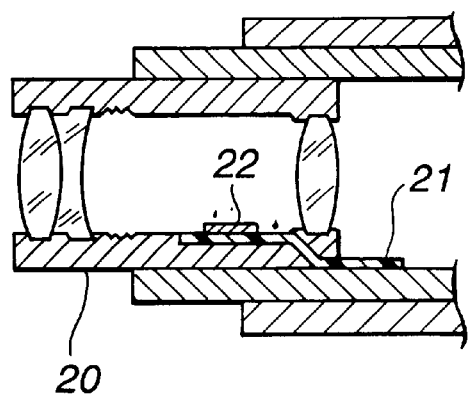
FIG. 4 is an enlarged sectional view showing a side surface of a camera according to the third embodiment of the present invention wherein a lens barrel is partially cut away.

FIG. 4 is an enlarged sectional view showing a side surface of a camera (comprising a flexible printed board) according to the third embodiment of the present invention when a lens barrel is partially cut away.

As shown in FIG. 4, the third embodiment is characterized in that a flexible printed board 21 on which a semiconductor 22 is flip-chip-bonded is arranged to be in contact with the inner wall surface of a zoom lens barrel 20 near a portion where the semiconductor 22 is bonded.

As in this embodiment, it is also assumed that the flexible printed board 21 has the same arrangement as that of the flexible printed board 2 in the first embodiment and that the flexible printed board 21 has no light-shielding property for external light.

The semiconductor 22 is flip-chip-bonded on the flexible printed board 21 arranged along the inner wall surface of the zoom lens barrel 20 such that the element formation surface of the semiconductor 22 faces the inner wall surface of the zoom lens barrel 20. In this manner, photographing light rays and stray light can be prevented.

For this reason, as in the third embodiment, the light-shielding property of the zoom lens barrel can prevent light from being incident on the semiconductor 22.

A camera (comprising a flexible printed board) according to the fourth embodiment of the present invention will be described below.

The fourth embodiment will be described again with reference to FIG. 1.

Referring to FIG. 1, a semiconductor 7 is flip-chip-bonded on one-end portion of a flexible printed board 2. The flexible printed board 2 at a portion where the semiconductor 7 is bonded is not directly positioned for a fixing member in the camera. In this case, the semiconductor 7 is bonded on the flexible printed board 2 such that the element formation surface of the semiconductor 7 is arranged upside down toward an outer member 1 of the camera. In this manner, external light received from a LCD window 3 or the seam of the outer member 1 can be prevented from being incident on the semiconductor 7.

As described above, according to the camera of each of the above embodiments, when a flexible printed board on which a semiconductor is flip-chip-bonded is used in a device such as a camera which is used out of doors or receives light, the semiconductor is properly bonded and arranged in the camera, i.e., the semiconductor is arranged such that the element surface of the semiconductor is arranged upside down toward a member comprising a light-shielding function in the camera. With this arrangement, external light being incident on the semiconductor element surface can be suppressed to a minimum, and an advantage of easily preventing a change in performance, an erroneous operation, and the like caused by the photo-electric effect of the element on the semiconductor can be obtained.

In this invention, it is apparent that working modes different in a wide range can be formed on this basis of this invention without departing from the spirit and scope of the invention. This invention is not restricted by any specific embodiment except as may be limited by the appended claims.

What is claimed is:

1. A camera comprising:
   a flexible printed board having opposing major surfaces on which a semiconductor element is flip-chip-bonded so that an element formation surface of the semiconductor element engages one of said major surfaces along a portion of the flexible printed board,
   a light-shieldable member forming part of said camera;
   wherein said element formation surface of said semiconductor element flip-chip-bonded on said flexible printed board is arranged to face said light shieldable member so that the portion of the flexible printed board on which the semiconductor element is bonded lies between the light shieldable member and the semiconductor element and the light shieldable member shields the element formation surface from light entering into the camera.

2. A camera according to claim 1, wherein said element formation surface of said semiconductor element is positioned close to a light-shieldable member.

3. A camera according to claim 2, wherein said light shieldable member is at least one of a housing, lens barrel, and member in said camera.

4. A camera according to claim 2 wherein said light shieldable member is a lens barrel, and the element formation surface of said semiconductor element flip-chip-bonded on said flexible printed board is arranged to face an inner wall of said lens barrel and so that said portion of said flexible printed board upon which the semiconductor element is bonded is positioned between a surface of the said inner wall and said semiconductor element whereby the inner wall serves to shield light from the element formation surface.

5. A camera according to claim 2, wherein said light shieldable member is a lens barrel, and said flexible printed board is arranged to be in contact with an inner wall of said lens barrel and to lie along the inner wall whereby the inner wall serves to shield light fro the element formation surface.

6. A camera according to claim 2, wherein said light-shieldable member is a hard printed board having a light-shielding property.

7. A camera according to claim 2 wherein said flexible printed board is formed of a layer of flexible conductive members arranged between outer layers of a flexible material which is light transmissive.

8. A camera comprising:
   an inner member;
   an outer member of said camera at least partially enclosing said inner member and having a light incident portion on which external light is partially incident;
   a flexible printed board; and
   a semiconductor element having an element formation surface and being flip-chip-bonded on said flexible printed board, said flexible printed board being arranged in said camera so that said element formation surface faces in a direction away from said light incident portion of said outer member of said camera, whereby the outer member of the camera shields the element formation surface from light entering into the camera.

* * * * *

UNITED STATES PATENT AND TRADEMARK OFFICE
CERTIFICATE OF CORRECTION

PATENT NO. : 6,311,023 B1
DATED : October 30, 2001
INVENTOR(S) : Watanabe

It is certified that error appears in the above-identified patent and that said Letters Patent is hereby corrected as shown below:

Column 3,
Line 24, delete "adhere" and insert therefor -- adheres --.

Column 4,
Line 60, delete "one-end portion" and insert therefor -- one end-portion --.

Column 6,
Line 18, after the word "light", delete "fro" and insert therefor -- from --.

Signed and Sealed this

Twenty-eighth Day of May, 2002

*Attest:*

*Attesting Officer*

JAMES E. ROGAN
*Director of the United States Patent and Trademark Office*